United States Patent [19]

Wong et al.

[11] 4,000,413
[45] Dec. 28, 1976

[54] MOS-RAM

[75] Inventors: Sau Ching Wong; Siu Keun Tsang, both of San Francisco, Calif.

[73] Assignee: Intel Corporation, Santa Clara, Calif.

[22] Filed: May 27, 1975

[21] Appl. No.: 580,629

[52] U.S. Cl. .......................... 307/208; 307/235 F; 307/238; 307/270; 307/279; 307/DIG. 1; 307/DIG. 3; 307/DIG. 4

[51] Int. Cl.² .................. H03K 3/353; H03K 5/13; H03K 5/18; H03K 3/286

[58] Field of Search .......... 307/235 F, 235 T, 238, 307/269, 270, 279, DIG. 1, DIG. 3, DIG. 4, DIG. 5, 208, 251

[56] References Cited
UNITED STATES PATENTS

| | | |
|---|---|---|
| 3,757,310 | 9/1973 | Croxon .......................... 307/238 X |
| 3,778,784 | 12/1973 | Karp et al. ..................... 307/238 X |
| 3,892,984 | 7/1975 | Stein ......................... 307/DIG. 3 X |
| 3,906,464 | 9/1975 | Lattin ....................... 307/DIG. 4 X |

*Primary Examiner*—John S. Heyman
*Assistant Examiner*—Larry N. Anagnos
*Attorney, Agent, or Firm*—Spensley, Horn & Lubitz

[57] ABSTRACT

Improved circuits for a MOS-RAM including an on chip TTL compatible high-level clock driver and sense amplifier. The driver employs a unique feedback and delay scheme allowing the high-level line to be quickly and efficiently discharged without using a large, high capacitance device. The upward swing of the control signal for the sense amplifier includes a perturbation which increases the sensitivity of the amplifier.

14 Claims, 4 Drawing Figures

MOS-RAM

BACKGROUND OF THE INVENTION

1. Field of the Invention

The invention relates to the field of metal-oxide-silicon (MOS) memories.

2. Prior Art

Numerous integrated circuits fabricated utilizing metal-oxide-silicon (MOS) technology such as random-access memories (RAM) and the like are known in the prior art. Typically the MOS circuits must interface with other components such as ECL or TTL circuitry. In interfacing with TTL circuitry or logic, the swing of the TTL signal is not directly compatible with most MOS circuitry. Many circuits are known for making a TTL signal compatible with MOS circuitry, however, most of such circuits are inefficient and consume relatively large amounts of power. In some cases, particularly for clock driving circuits in memories a TTL/MOS buffer is deployed on a separate substrate for interfacing the MOS memory with the TTL circuit.

As will be seen, the improved MOS-RAM circuitry disclosed in this application includes a unique buffer which may be used for producing a high-level clock signal, or the like, in response to an input TTL signal. The buffer is both efficient and effective, and unlike prior art circuits does not require a large pull-down device to discharge the high-level line.

Bistable MOS sense amplifiers for sensing the discharging or charging of a line in an MOS memory array are commonly utilized. Often, particularly in dynamic memories, the loads of the bistable circuits are clocked to prevent the amplifier from dissipating power when not in use. Some prior art sense amplifiers also include a gating or common transistor coupled in series with both legs of the amplifier for selectively controlling current flow in both legs of the sense amplifier. It has been recognized in the prior art that if this latter transistor is allowed to conduct prior to the time that the loads of the sense amplifier conduct the sensitivity of the amplifier is increased. This increased sensitivity is due in part to the large loads caused by the non-conducting amplified loads. In some circuits, two generators have been used to cause the loads to be activated subsequent to the activation of the common transistor. As is apparent, care must be taken to assure proper timing between the activation of the loads and common transistor.

The present invention provides the advantage gained with two generators for sequentially activating the load transistors and common transistor, however, with a single generator. A perturbation or hesitation in the driving signal for the sense amplifier, which is coupled to both the loads and common transistor, provides the same desired result obtained in the prior art.

SUMMARY OF THE INVENTION

An MOS circuit for generating a high-level output signal from a low-level input signal is described. The circuit includes an output line and a first MOS transistor for charging the output line in response to the low-level input signal, and hence the first transistor is coupled to the output line. A second transistor is used for discharging the output line, the second transistor is coupled to a driving means. The driving means includes a circuit means which is enabled by a signal delayed in time from the high-level output signal. The circuit allows the high level line to be efficiently discharged.

DETAILED DESCRIPTION OF THE INVENTION

The present invention disclosed two unique circuits used in an improved random-access memory (RAM). The memory is fabricated in its preferred embodiment as a 4K memory (RAM) on a silicon substrate employing a metal-oxide-silicon (MOS) technology. The field-effect transistors utilized in the memory are fabricated with polycrystalline silicon gates and comprise n-channel devices. As will be appreciated many of the specific details disclosed herein are not critical to the invention, but nevertheless are disclosed to provide a thorough understanding of the invented circuits.

Figure 1:
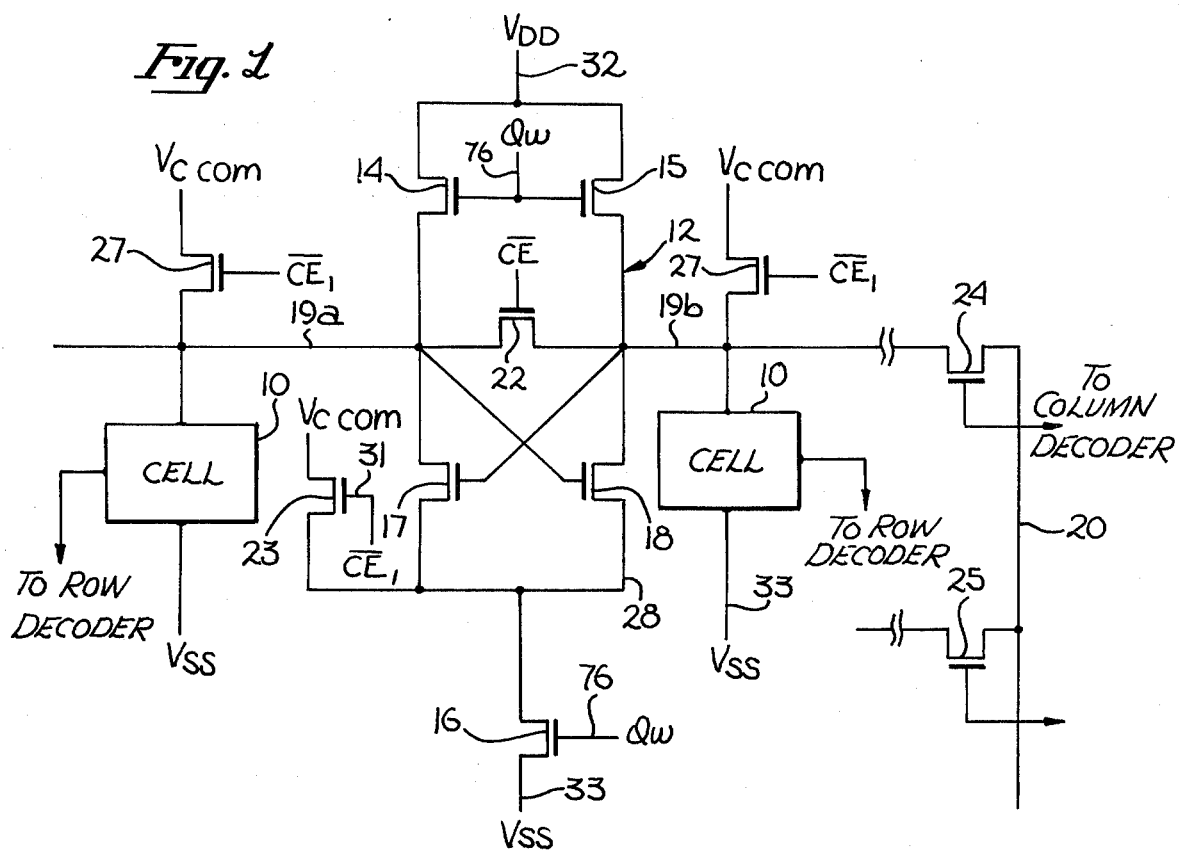
FIG. 1 is a partial section of a memory array including a sense amplifier which is used in conjunction with the disclosed circuits.

Referring first to FIG. 1, a portion of a single column line of the memory array is illustrated and comprises lines 19a and 19b generally bisect by a sense amplifier 12. This column line communicates with an input/output bus 20 through a transistor 24. The gate of transistor 24 is coupled to a column decoder (not illustrated). In a similar manner other column lines in the array are coupled to the input output bus 20, for example, one line is partially shown coupled through transistor 25 to bus 20. A plurality of memory cells 10 are coupled to the column and row lines in the array. As presently fabricated each cell includes a single active device (an MOS transistor) and a capacitance storage means.

The decoder circuits, timing circuits, cells, buffers, input/output circuitry, and other peripheral circuits of the memory are not shown in the present disclosure since known circuits are utilized. In the presently preferred embodiment the circuits utilized are substantially similar to those disclosed in co-pending application Ser. No. 520,797, filed Nov. 4, 1974, and now U.S. Pat. No. 3,959,781 assigned to the assignee of the present invention except that known address multiplexing is used.

Figure 3:
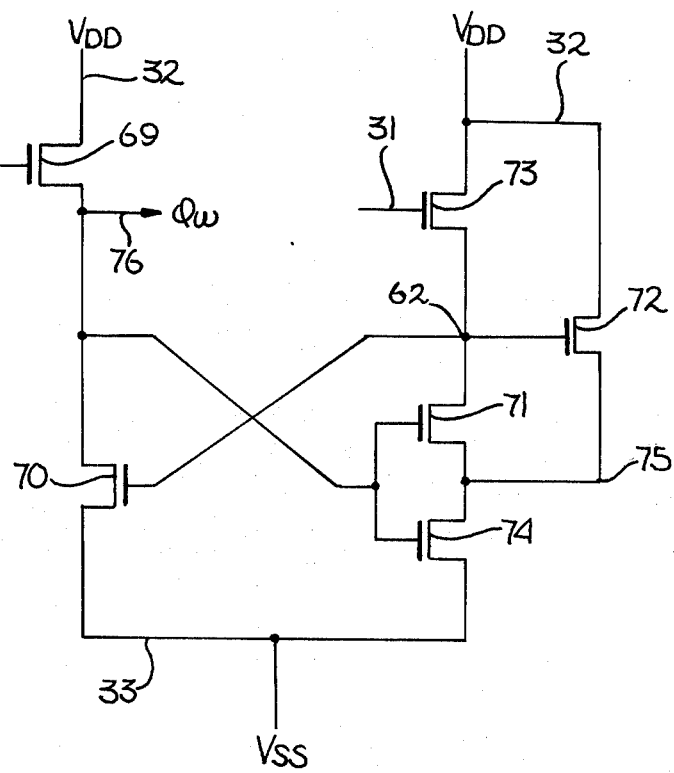
FIG. 3 is a circuit diagram of the generator used for driving the sense amplifier illustrated in FIG. 1.
Figure 2:
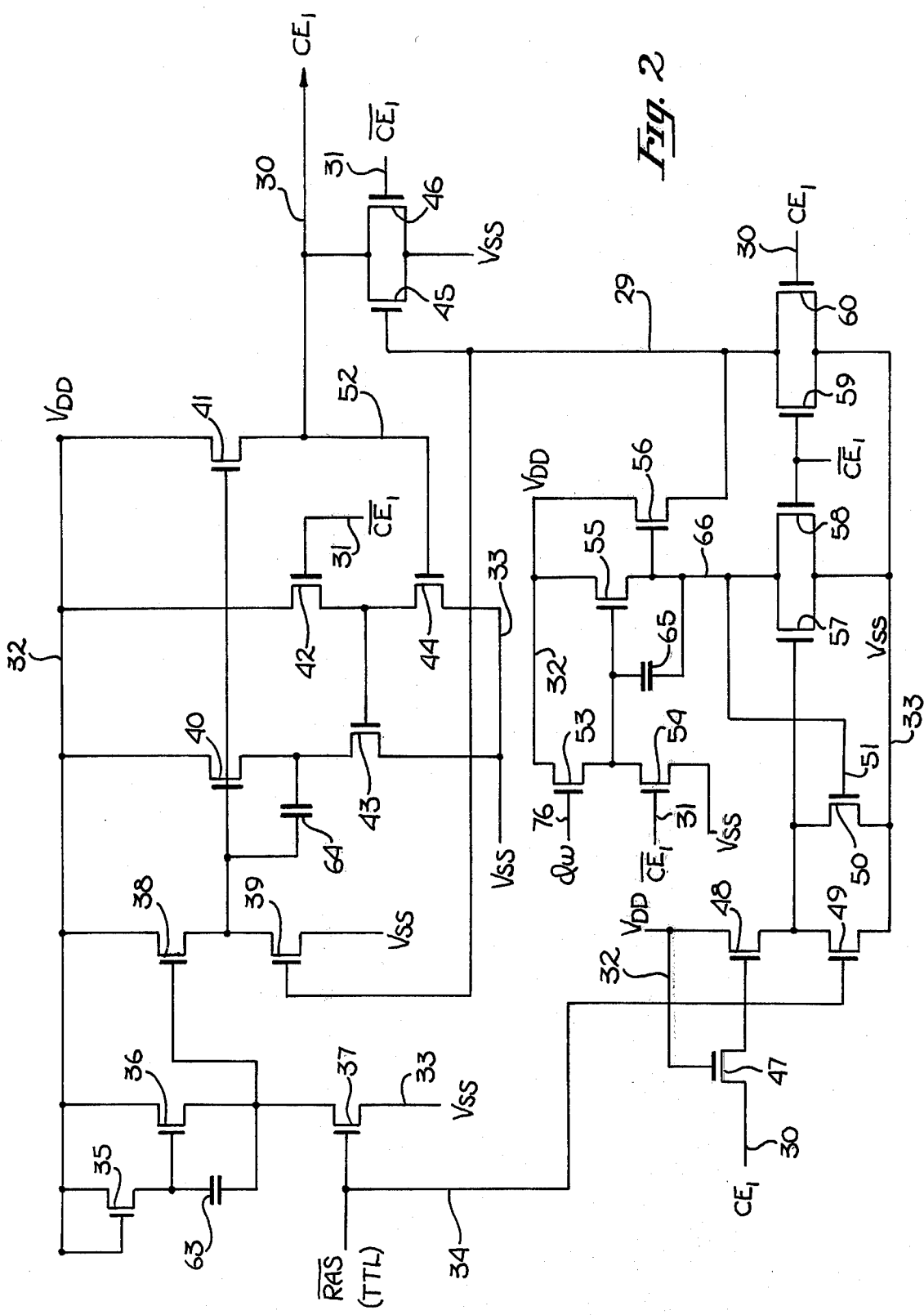
FIG. 2 is a circuit diagram of the TTL compatible high-level clock driving circuit of the present invention.

The memory is powered by a positive potential $V_{DD}$ identified in FIGS. 1, 2 and 3 as line 32. Substrate biasing is also employed, however it is not illustrated in the drawings. Memory ground is illustrated as $V_{SS}$, line 33. One input timing signal to the memory is identified in FIG. 2 as $\overline{RAS}$. The row address strobe (RAS) signal is used within the multiplexing decoding system of the memory, and its use within the decoding system is not discussed, since it is known in the art. The $\overline{RAS}$ signal is a TTL level signal and is converted within the memory to a high-level clocking signal ($CE_1$) of sufficient magnitude and power to drive the appropriate MOS circuitry of the memory. In FIG. 2, specifically the memory receives an $\overline{RAS}$ signal at an input terminal (line 34) and generates an output signal identified on lines 30 as $CE_1$ (Chip Enable). In an inverting buffer (not illustrated) the $\overline{CE_1}$ signal is generated from the $CE_1$ signal, and hence the rise and decay of the $\overline{CE_1}$ follows (in time) the $CE_1$ signal. The memory also generates a $\phi_w$ signal which is used for reading and writing (and refreshing) information in the array as described in the above mentioned application. However, the $\phi_w$ signal is modified with circuitry illustrated in FIG. 3 to increase the sensitivity of the sense amplifiers, such as sense amplifier 12 of FIG. 1. The memory also employs a positive potential $V_{CCOM}$ which is regulated within the memory, and as will be seen this potential is used for precharging the column lines in the array and a node of the sense amplifier.

Referring to FIG. 1 the sense amplifier 12 comprises a bistable or flip-flop type circuit having a first branch which includes transistors 14 and 17 coupled in series and a second branch which includes transistors 15 and 18 coupled in series. The common node between transistors 4 and 17 is coupled to line 19a and to the gate of transistor 18, while the common node between transistors 15 and 18 is coupled to line 19b and the gate of transistor 17. The sources of transistors 17 and 18 (node 28) are coupled to the $V_{SS}$ potential (line 33) through transistor 16. The gate of transistor 16 is coupled to the source of the $\phi_w$ signal (line 76) as are the gates of transistors 14 and 15. As is apparent transistors 14 and 15 act as loads for the sense amplifier 12, and additionally the sense amplifier requires that transistor 16 conducts before the amplifier is activated.

The column lines in the array such as lines 19a and 19b and node 28 of sense amplifier 12, and the equivalent node in the other sense amplifiers of the array are precharged during the period of time that the $\overline{CE_1}$ is positive. Specifically, the column lines 19a and 19b are charged through transistor 23. Transistor 22 which conducts during the period of time that the $\overline{CE_1}$ is positive is used to equalize the potential on lines 19a and 19b prior to the time that the sense amplifier is activated.

As previously mentioned a single input/output bus 20 is utilized, and hence information which is read into and read from cells to the left of the sense amplifiers must pass through a sense amplifier thus, if a binary one is read onto line 19b from the bus 20 and is stored in a cell on the left side of the array, the binary one is stored in the form of zero. However, when this zero is read from the cell it again passes through the bistable sense amplifier before reaching the input/output bus 20, and is inverted and read as a binary one. As discussed in the above identified application, dummy cells not shown in FIG. 1 are utilized when information is read from a cell. When information is to be read from a cell in the array, as is done in the prior art, the discharger of the precharged column line caused by the selected cell is sensed by the sense amplifier, setting the sense amplifier in one of its two stable states.

Referring to FIG. 2 a TTL compatible buffer used as a clock driver is illustrated; the circuit in response to an input signal ($\overline{RAS}$) applied to line 34. The output of the circuit, line 30, generates in a high-level clock signal ($CE_1$) compatible with MOS circuitry. The circuit utilizes the $\overline{CE_1}$ signal which signal is generated in an inverting buffer not illustrated. A signal delayed in time from the $CE_1$ signal is also used by the circuit; any one of numerous, commonly known, circuits for delaying a signal (in time) may be utilized. In the presently preferred embodiment the $\phi_w$ signal, line 76, is utilized since this signal is present on the chip, however, other signals may be utilized, for example, the $CE_1$ signal may be delayed and utilized to activate transistor 53.

In the circuit of FIG. 2 the upper portion of the circuit is generally utilized to charge line 30 to $V_{DD}$ through the output transistor 41, while the lower portion of the circuit is utilized to discharge line 30, primarily through transistor 45. Transistors 35, 36 and 37 along with capacitor 63 are used to provide a bootstrapping potential to the gate of transistor 38. The drains of transistors 35 and 36 along with the gate of transistor 35 are coupled to line 32. The source terminal of transistor 35 and the gate of transistor 36 are coupled to one terminal of capacitor 63. The other terminal of capacitor 63 is coupled to the source of transistor 36 and the gate of transistor 38, and also to the drain of the input transistor 37. The source terminal of transistor 37 is coupled to line 33. The gate of transistor 37 receives the TTL input signal ($\overline{RAS}$) on line 34.

Transistors 38 and 39 are coupled in series between line 32 and line 33 with the gate of transistor 39 being coupled to line 29. As will be seen, transistor 39 is used to couple the gate of transistor 41 to ground when the $\overline{RAS}$ signal changes to its higher state. The common junction between transistors 38 and 39 is coupled to one terminal of capacitor 64, the gate of transistor 40, and the gate of the output transistor 41.

Transistors 40, 42, 43 and 44, along with capacitor 64, are generally used to bootstrap the gate of transistor 41. This bootstrapping is initiated by a rise of potential on line 30 which rise is fedback through feedback line 52 to the gate of transistor 44. Transistor 44 and transistor 42 are coupled in series between $V_{DD}$ and line 33. The common junction between these two transistors is coupled to the gate of transistor 43. The gate of transistor 42 is coupled to line 31, thus providing a positive signal to the gate of transistor 43 from line 32, when the $\overline{CE_1}$ signal is positive. Transistor 40 is coupled in series with transistor 43 between line 32 and line 33 with the common junction between these two transistors being coupled to the other terminal of capacitor 64. As mentioned the output line 30 is coupled to the $V_{DD}$ potential through transistor 41, line 30 is also coupled to $V_{SS}$ through the parallel combinations of transistors 45 and 46.

The circuit for activating transistor 45, and thus for discharging line 30 operates in response to the input $\overline{RAS}$ signal, (line 34) which is applied to the gate of transistor 49. Transistor 49 is coupled in series with transistor 48 between $V_{DD}$ and line 33. The gate of transistor 48 is coupled to one terminal of transistor 47 while the other terminal of transistor 47 is coupled to the source of the $CE_1$ signal. The gate of transistor 47 is coupled to line 32, thus the gate of transistor 47 always receives a positive potential.

Transistors 55 and 57 are coupled in series between line 32 and line 33 and these transistors form an active inverter, that is, an inverter where both transistors conduct simultaneously. Transistor 57 is shunted by transistor 58, the gate of transistor 58 is coupled to line 31. The common node between transistors 55 and 57, node 66, is coupled to one terminal of a bootstrap capacitor 65. This capacitor is used to bootstrap the gate of transistor 55, and hence the other terminal of capacitor 65 is coupled to the gate of transistor 55 and also to the common junction between the series combination of transistors 53 and 54. The gate of transistor 53 receives the delayed signal, $\phi_w$, while the gate of transistor 54 is coupled to the source of the $\overline{CE_1}$ signal, line 31. Node 66 is also coupled to the gate of transistor 56, and through line 51 to a latching transistor 50.

Line 29 which carries the signal to activate transistor 45 is coupled to the source terminal of transistor 56 and also to the drain terminals of the parallel combination of pulldown transistors 59 and 60. The gate of transistor 60 is coupled to line 30, while the gate of transistor 59 is coupled to line 31. As is apparent line 29 will be coupled to ground ($V_{SS}$) whenever the $\overline{CE_1}$ signal is positive, or whenever the $CE_1$ signal is positive. However, transistor 60 is a much smaller device than transistor 56, thus when transistor 56 conducts even though transistor 60 is conducting a positive potential will appear on line 29.

Figure 4:
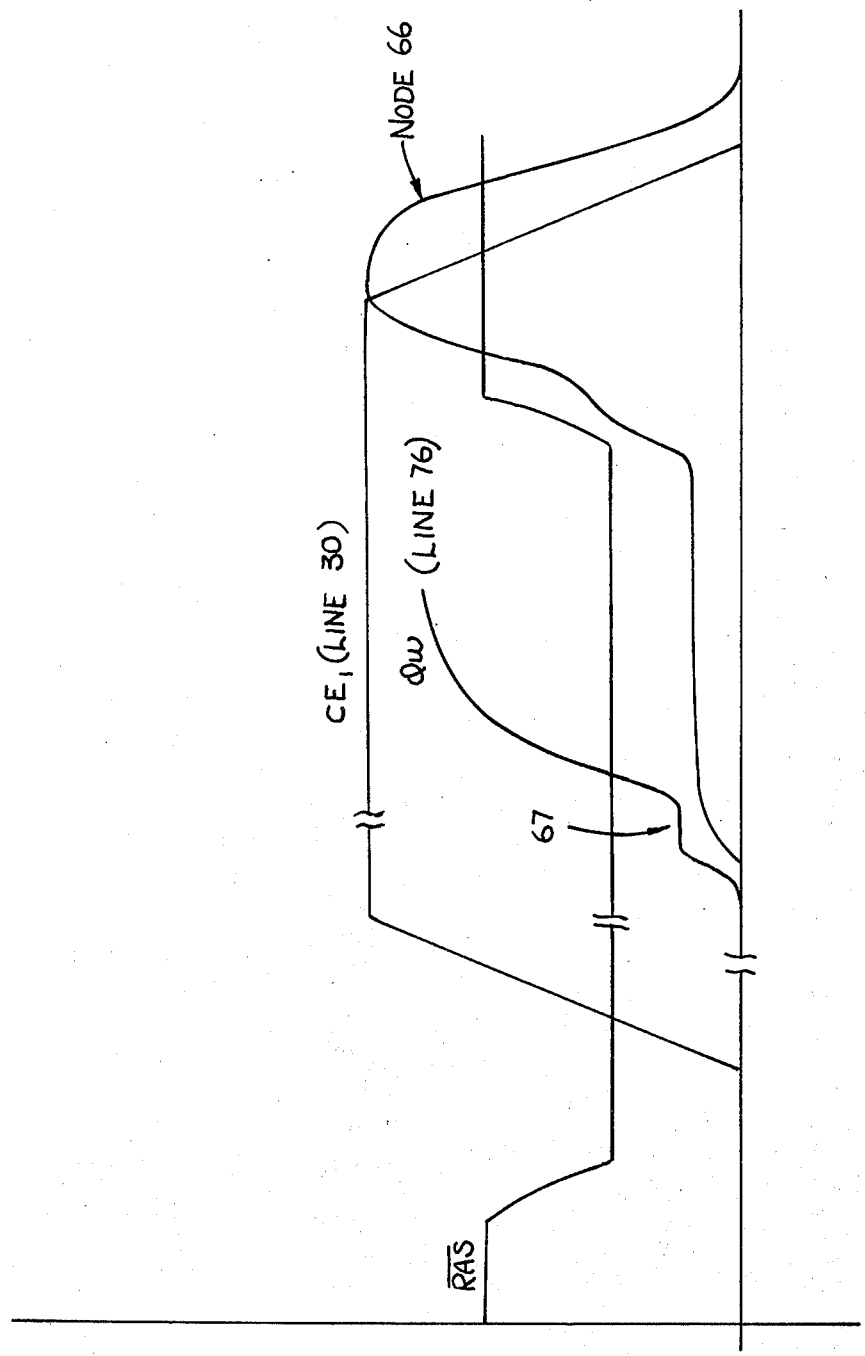
FIG. 4 is a graph of several waveforms associated with the circuits of FIGS. 2 and 3.

Referring to FIGS. 2 and 4, the operation of the circuit of FIG. 2 will be examined in conjunction with the waveforms of FIG. 4. First the circuit of FIG. 2 will be examined prior to the time that the $\overline{RAS}$ signal drops to its lower level; during this period of time the $CE_1$ signal is in its low level while the $\overline{CE_1}$ signal (not illustrated) is positive. The $\overline{CE_1}$ signal which is applied to the gate of transistor 46 causes line 30 to be held at the $V_{SS}$ potential. In the presently preferred embodiment transistor 46 is a relatively small transistor and is not used to discharge line 30, but rather to clamp it to $V_{SS}$. Also, as previously mentioned, transistor 43 will conduct coupling one terminal of capacitor 64 to ground. However, capacitor 64 is not charged during this period, but rather after the $\overline{RAS}$ signal changes to its lower state. The $\overline{CE_1}$ signal through transistor 59 assures that during this period of time transistor 45 is not conducting since it couples the gate of transistor 45 to $V_{SS}$. Node 66 through transistor 58 is held close to ground potential preventing transistor 56 from conducting. Also through transistor 54 one terminal of capacitor 65 is held to $V_{SS}$. Thus, during this period of time, line 30 is held at $V_{SS}$ as shown in FIG. 4.

When the $\overline{RAS}$ signal is in its higher state transistor 37 conducts providing a path through which capacitor 63 is charged. When the $\overline{RAS}$ signal moves to its lower state, transistor 37 conducts less causing the common junction between transistors 36 and 37 to rise in potential, and also causing the gate of transistor 38 to be bootstrapped because of the previous charging of capacitor 63. As transistor 38 begins to conduct it causes transistors 40 and 41 to conduct thereby raising the potential on line 30. Note that even though transistor 46 is still conducting since transistor 41 is approximately 45 times the size of transistor 46 the potential on line 30 increases. Prior to the time that the potential on line 30 begins to rise, but after transistor 38 begins to conduct capacitor 64 is charged through transistors 38 and 43. The rise of potential on line 30 is sensed by transistor 44 through the feedback line 52 causing transistor 43 to cease conducting since its gate becomes coupled to ground through transistor 44. In the presently preferred embodiment, transistor 44 is approximately ten times the size of transistor 42, and thus, even though, the $\overline{CE_1}$ signal may be present, transistor 41 is able to pull the gate of transistor 43 towards ground. As transistor 43 ceases to conduct the gates of transistors 40 and 41 are bootstrapped by capacitor 64. This bootstrapping causes transistor 41 to conduct even harder, thus raising the potential on line 30 to $V_{DD}$. After the $CE_1$ signal begins to rise in potential the $\overline{CE_1}$ inverting buffer begins to cause the $\overline{CE_1}$ signal to drop towards $V_{SS}$, thus allowing line 30 to be pulled to $V_{DD}$ by transistor 41.

When the $CE_1$ signal is positive transistor 48 conducts thereby causing transistor 57 to conduct. Note that at this period of time transistors 58 and 59 are not conducting since the $\overline{CE_1}$ signal is at ground potential.

Since transistor 57 is conducting, node 66 is effectively clamped to $V_{SS}$ preventing transistor 56 from conducting. When the $\phi_w$ signal becomes positive, transistors 53 and 55 conduct, however as shown in FIG. 4, node 66 does not rise in potential substantially, and in fact is at approximately ≤ one volt, thus transistor 56 does not conduct. In the presently preferred embodiment transistor 57 is approximately six times as large as transistor 55 to assure that transistor 56 does not conduct at this time. When the $\phi_w$ signal becomes positive capacitor 65 is charged through the path which includes transistors 53 and 57.

When the $\overline{RAS}$ signal returns to its upper state transistor 49 conducts more heavily which in turn causes transistor 57 to conduct less. As transistor 57 begins to conduct less, node 66 rises in potential, and through the latch transistor 50 set by line 51, the gate of transistor 57 is pulled towards ground. As node 66 rises in potential the gate of transistor 55 is bootstrapped causing transistor 56 to begin conducting and the potential on line 29 to rise. This potential causes transistor 45 to conduct pulling down line 30, and transistor 39 to conduct reducing the potential on the gate of the output transistor 41. As the potential on line 30 drops, transistor 60 conducts less allowing transistor 45 to more quickly reduce the charge on line 30. Note that since the $\overline{CE_1}$ signal is generated from the $CE_1$ signal, transistor 59 does not begin conducting immediately since there is a delay between the delay of the $CE_1$ and the rise of the $\overline{CE_1}$. Thus with the circuit of FIG. 2, line 30 is quickly discharged through transistor 45. If transistor 45 had been coupled to the $\overline{RAS}$ signal, since the swing of this signal is relatively small, transistor 45 would have to have been very large, adding considerable capacitance to line 30. Also, if the signal on line 76 is not delayed from the $CE_1$ signal, instability may occur at node 66 causing transistor 56 to prematurely conduct.

Referring to FIG. 3, a $\phi_w$ generator 68 is illustrated which may be any one of a number of known circuits for generating a waveform such as generators disclosed in the above identified application. The generator 68 produces an output signal for driving output transistor 69. The output transistor 69 has its drain coupled to the $V_{DD}$ potential, while its source is common with line 76. The remaining circuitry of FIG. 3 is used to generate the "glitch" or perturbation 67 shown in FIG. 4. Line 76 is coupled to the $V_{SS}$ potential through transistor 70, and also is coupled to the gates of transistors 71 and 74. Transistors 73, 71 and 74 are coupled in series between lines 32 and 33. The gate of transistor 73 is coupled to line 31, while the source of transistor 73, node 62, is coupled to the gate of transistor 72, the drain of transistor 71 and the gate of transistor 70. Transistor 72 is coupled between line 32 and the common junction between transistors 71 and 74.

During the period of time that the $\overline{CE_1}$ signal is positive, transistor 73 conducts charging node 62. When node 62 is charged transistor 72 conducts thereby charging node 75. When the $\phi_w$ signal begins to climb as is shown in FIG. 4 (the $\overline{CE_1}$ signal is at $V_{SS}$ at this time) the potential on line 76 rises even though transistor 70 is conducting. In the presently preferred embodiment the ratio in the size of transistor 69 to 70 is 0.8. At this point in the operation of the circuit of FIG. 3, the perturbation 67 occurs, momentarily preventing the $\phi_w$ signal from continuing its upward swing. The potential on line 76 causes transistor 74 to begin conducting which in turn causes node 75 to begin discharging.

However, since node 62 is charged, transistor 72 continues to conduct thereby preventing a rapid discharge of node 75. Eventually the potential on line 76 causes transistor 74 to conduct sufficiently to discharge node 75 to the point where transistor 71 will begin conducting. When transistor 71 begins conducting, node 62 begins to discharge causing, in rapid succession, the discharge of the charge on nodes 62 and 75, and transistor 70 to cease conducting. This allows the $\phi_w$ signal to continue rising in potential as shown in FIG. 4. The duration of perturbation 67 of FIG. 4 may be adjusted by adjusting the ratio of the size of transistor 72 and 74.

The circuit of FIG. 3 less the $\phi_w$ generator 68 and transistors 69 and 70 operate substantially as a Schmidt trigger thus similar known circuits may be utilized to generate the perturbation 67 as shown in FIG. 4.

Referring now to FIGS. 1 and 4, assume that the sense amplifier 12 is to sense the state of line 19a or 19b, and that the $\phi_w$ signal is applied to the gates of the load transistors 14 and 15 and to the common transistor 16. The positive potential applied to the gate of transistor 16 readily causes this transistor to begin conducting since this transistor has its source terminal coupled to ground. On the other hand transistors 14 and 15, since their source terminals are coupled to lines which have been previously precharged do not initially conduct. During the period of time that perturbation is present on line 76, transistor 16 conducts while transistors 14 and 15 do not conduct. The relatively high resistance of transistors 14 and 15 cause the sense amplifier 12 to have a high gain and suppress noise associated with some prior art sense amplifiers. When the $\phi_w$ signal again continues to rise in potential, the load transistors 14 and 15 conduct and the sense amplifier operates in a normal fashion. Note that with a single signal ($\phi_w$) the desired results known in the prior art are achieved.

Thus, improvements in a MOS RAM have been disclosed which permit efficient TTL compatibility and increased sensitivity.

We claim:

1. An MOS circuit for generating a high-level output signal from a low-level input signal comprising:
    an output line,
    a first MOS transistor for charging said output line in response to said low-level input signal, said first transistor being coupled to said low level input signal and said output line,
    a second transistor for discharging said output line coupled to said output line,
    driving means coupled to said second transistor for driving said second transistor, said driving means including circuit means enabled by a signal delayed in time from said high level output signal,
    whereby said high level line may be efficiently discharged.

2. The MOS circuit defined by claim 1 wherein said circuit means of said driving means includes a bootstrap circuit.

3. The MOS circuit defined by claim 2 wherein said circuit means of said driving means includes a capacitor which is charged.

4. The MOS circuit defined by claim 1 wherein said circuit means of said driving means includes an active inverter.

5. The MOS circuit defined by claim 4 wherein said first and second transistors are n-channel field-effect transistors.

6. The MOS circuit defined by claim 5 wherein said first and second transistors employ polycrystalline silicon gates.

7. An MOS circuit for receiving a TTL signal and for providing a high-level output signal comprising:
    an output line,
    a first MOS transistor for charging said output line, coupled to said output line,
    a first bootstrap means for receiving said TTL signal,
    a second bootstrap means for driving said first MOS transistor, coupled to said first bootstrap means, said first MOS transistor and said output line,
    a second MOS transistor for discharging said output line, coupled to said output line,
    generator means for generating a control signal, said control signal being delayed in time from said high-level output signal,
    a third bootstrap means coupled to said second MOS transistor and said generator means for receiving said TTL signal, said third bootstrap means including a capacitor charged in response to said control signal,
    whereby said output line may be effectively discharged by said second transistor.

8. The MOS circuit defined by claim 7 wherein said third bootstrap means includes an active inverter having a bootstrapped node said node being coupled to said capacitor.

9. The MOS circuit defined by claim 8 wherein said node is coupled to a latch circuit for locking out said TTL signal.

10. The MOS circuit defined by claim 9 wherein said first and second transistors comprises n-channel field-effect transistors.

11. The circuit defined by claim 10 wherein said first and second transistors include polycrystalline silicon gates.

12. In an MOS memory employing a sense amplifier comprising a bi-stable circuit having a first branch which uses a first MOS transistor as a load, and a second branch which uses a second MOS transistor as a load, and where said amplifier is activated by at least a third MOS transistor, the improvement comprising:
    a signal generator coupled to the gates of said first, second and third MOS transistors for activating said first, second and third MOS transistors, said generator generating a signal having a perturbation such that said third transistor conducts prior to the time that said first and second transistors conduct.

13. The improvement defined by claim 12 wherein said first, second and third transistors are n-channel devices.

14. The improvement defined by in claim 12 wherein the drain terminals of said first and second transistors are coupled to a source of positive potential.

* * * * *